United States Patent
Guerra et al.

(10) Patent No.: US 9,432,236 B2
(45) Date of Patent: Aug. 30, 2016

(54) SYSTEM FOR GENERATING A CALIBRATION SIGNAL, RELATED TRANSCEIVER AND METHOD

(71) Applicant: STMicroelectronics S.r.l., Agrate Brianza (IT)

(72) Inventors: Ranieri Guerra, S. Giovanni la Punta (IT); Giuseppe Palmisano, S. Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/829,775

(22) Filed: Aug. 19, 2015

(65) Prior Publication Data

US 2016/0094378 A1 Mar. 31, 2016

(30) Foreign Application Priority Data

Sep. 25, 2014 (IT) .............................. TO2014A0756

(51) Int. Cl.
| | |
|---|---|
| H03C 1/52 | (2006.01) |
| H04L 27/02 | (2006.01) |
| H04L 27/36 | (2006.01) |
| H04L 7/00 | (2006.01) |
| H03B 19/14 | (2006.01) |
| H03B 21/02 | (2006.01) |
| H03D 7/16 | (2006.01) |

(52) U.S. Cl.
CPC ............. *H04L 27/364* (2013.01); *H03B 19/14* (2013.01); *H03B 21/025* (2013.01); *H03D 7/165* (2013.01); *H04L 7/0091* (2013.01); *H04L 27/366* (2013.01)

(58) Field of Classification Search
CPC . H04L 27/364; H04L 27/366; H04L 7/0091; H04B 1/40; H03B 21/01; H03B 21/02
USPC ....... 375/219, 220, 221, 222, 224, 270, 301, 375/321, 302; 455/76; 331/2
See application file for complete search history.

(56) References Cited

U.S. PATENT DOCUMENTS

| | | | |
|---|---|---|---|
| 6,574,462 B1 * | 6/2003 | Strange ................. | H03B 21/02 331/2 |
| 2002/0039894 A1 | 4/2002 | Yoshida et al. | |
| 2007/0081610 A1 * | 4/2007 | Krivokapic ............ | H03B 21/01 375/302 |
| 2009/0075603 A1 * | 3/2009 | Li Puma ................. | H04B 1/40 455/76 |
| 2013/0033330 A1 | 2/2013 | Longstone et al. | |

OTHER PUBLICATIONS

IT Search Report and Written Opinion for IT TO2014A000756 mailed May 15, 2015 (9 pages).
Nand, Nitin R, et al: "Ultra-Stable Very-Low Phase-Noise Signal Source for Very Long Baseline Interferometry Using a Cryocooled Sapphire Oscillator," IEEE Transactions on Microwave Theory and Techniques, IEEE Service Cetner, Piscataway, NJ, vol. 59, No. 11, Nov. 30, 2011, pp. 2978-2986, XP011389139.

(Continued)

*Primary Examiner* — Phuong Phu
(74) *Attorney, Agent, or Firm* — Gardere Wynne Sewell LLP (57) ABSTRACT

A calibration signal is generated from a modulating signal having a first frequency and a carrier signal having a second frequency. A single-sideband mixer modulates the modulating signal on the carrier signal. At least two frequency dividers by two connected in cascade receive the modulating signal modulated on the carrier signal and generate an output of the calibration signal.

17 Claims, 6 Drawing Sheets

(56) References Cited

OTHER PUBLICATIONS

Sen, Shreyas, et al: "DSP Assisted Low Cost IQ Mismatch Measurement and Compensation Using Built in Power Detector," IEEE 2010, pp. 336-339.

Steila, Oscar: "Automatic In-phase Quadrature Balancing AIQB," Oct. 2006, www.qsl.net\ik1xpv (9 pages).

Yu, Li, et al: "A Novel Adaptive Mismatch Cancellation System for Quadrature IF Radio Receivers," IEEE Transactions on Circuits and Systems—II: Analog and Digital Signal Processing, vol. 46, No. 6, Jun. 1999, pp. 789-801.

* cited by examiner

Fig. 12

SYSTEM FOR GENERATING A CALIBRATION SIGNAL, RELATED TRANSCEIVER AND METHOD

PRIORITY CLAIM

This application claims priority from Italian Application for Patent No. TO2014A000756 filed Sep. 25, 2014, the disclosure of which is incorporated by reference.

TECHNICAL FIELD

The present disclosure relates to solutions for generating a calibration tone or signal with high rejection of its own image. For instance, such a signal can be used for calibration of a wireless receiver.

BACKGROUND

Figure 1:
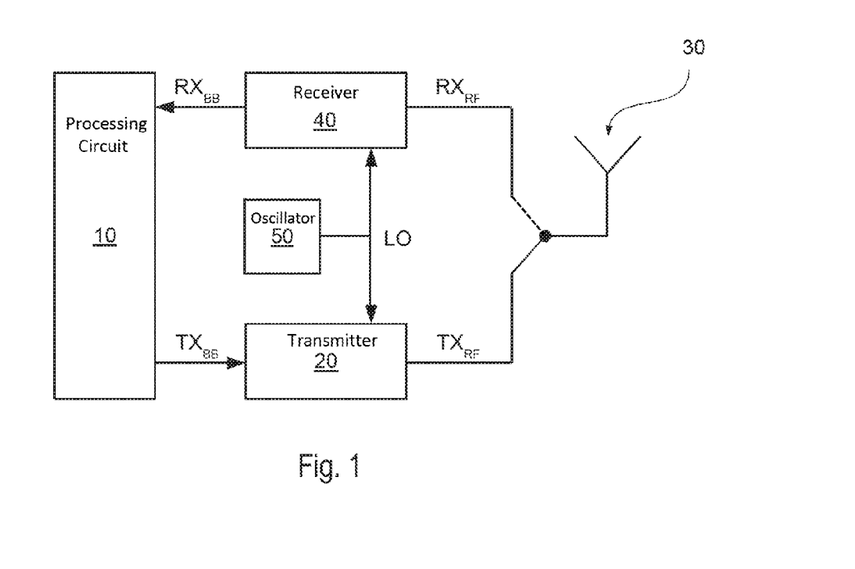

FIG. 1 shows a block diagram of a generic wireless transceiver, in which a processing circuit 10, such as, for example, a digital signal processor (DSP), supplies a baseband (BB) transmitting signal $TX_{BB}$.

The baseband transmitting signal $TX_{BB}$ is converted by a transmitter circuit 20 into a radio-frequency (RF) transmitting signal $TX_{RF}$. For instance, typically the aforesaid transmitter circuit 20 comprises a modulator, such as for example a mixer or an analog multiplier, which modulates the signal $TX_{BB}$ with a high-frequency signal LO. In addition, the aforesaid transmitter circuit may also comprise filters, amplifiers, etc.

Finally, the transmitting signal $TX_{RF}$ is sent to at least one antenna 30.

In a complementary way, a radio-frequency receiving signal $RX_{RF}$ received via the antenna 30 is converted via a receiver circuit 40 into a baseband receiving signal $RX_{BB}$. For instance, typically the aforesaid receiver circuit 40 comprises a demodulator, such as for example a mixer, which demodulates the signal $RX_{RF}$ using the frequency signal LO. Also the receiver circuit may comprise filters, amplifiers, etc.

For instance, the carrier signal LO may be supplied by an oscillator or synthesizer 50.

A particular architecture of the receiver 40 is the architecture of a so-called "low-IF" type.

Receivers with a low-IF architecture are commonly used in transceiver systems due to their relatively low complexity and robustness. Basically, in a low-IF receiver, the radio-frequency signal $RX_{RF}$ received is demodulated at a lower, non-zero, frequency, the so-called "intermediate frequency" (IF), which may typically range from hundreds of kilohertz to some megahertz. Consequently, the main characteristic of the aforesaid architecture consists in the fact that the radio-frequency signal $RX_{RF}$ received is converted by means of a system of a heterodyne type to a significantly lower frequency, hereinafter designated by $f_{IF}$. In particular, the heterodyne system is implemented through a mixer that carries out multiplication of the radio-frequency signal by an ideally pure tone (LO) with frequency $f_{LO}$, appropriately generated by the synthesizer 50 in such a way that $$f_{IF}=f_{RF}-f_{LO} \quad (1)$$

The high-frequency components generated by the multiplication can be subsequently filtered along the receiving chain.

The choice of the frequency $f_{IF}$ has a considerable effect on the design of the analog system in so far as, if it is sufficiently high, it enables reduction of the problems of flicker noise and DC offsets generated by the chain of receiver circuits. On the other hand, an excessive increase of the frequency $f_{IF}$ may lead to an increase of the power dissipation of the analog-to-digital converter (ADC) and also of the DSP in so far as it requires a higher working frequency.

Low-IF receivers normally use in-quadrature signals (i.e., of a complex-envelope type) both to facilitate demodulation thereof and to solve the problem of image rejection.

Figure 2:
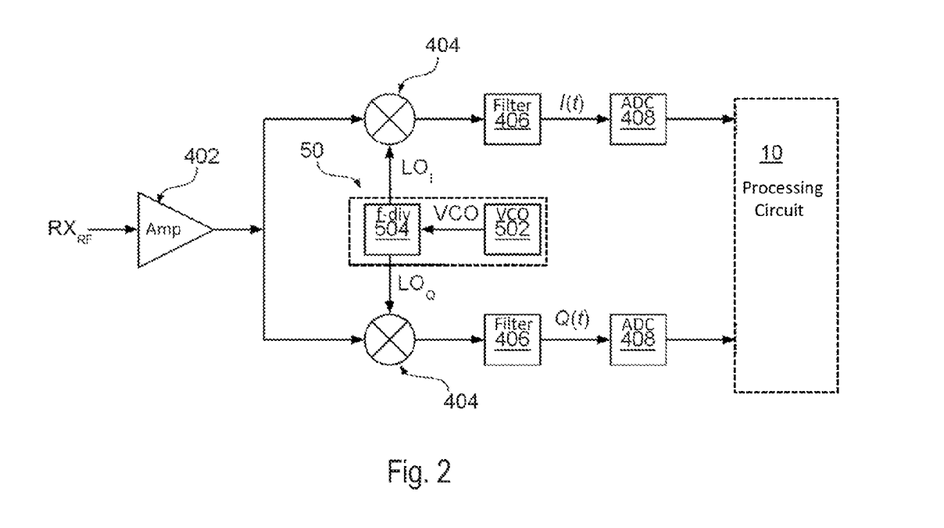

Consequently, as highlighted in FIG. 2, the low-IF receiver circuit 40 receives at input the radio-frequency receiving signal $RX_{RF}$.

In the example considered, the aforesaid signal $RX_{RF}$ is amplified via an amplifier 402, such as for example a low-noise amplifier (LNA).

In particular, in the case where the receiver 40 supplies to the DSP 10 a complex signal, the amplified RF signal, i.e., the signal at output from the amplifier 402, is sent to two branches: a first branch for the in-phase (I) component and a branch for the quadrature (Q) component.

In this case, each branch comprises a demodulator 404, such as for example a mixer, which carries out multiplication of the radio-frequency signal by respective signals $LO_I$ and $LO_Q$, and a filter 406, which, by filtering the high-frequency components, yields the evolution in time of the respective component I(t) and Q(t).

To interface the aforesaid signals with the processing circuit 10 respective analog-to-digital (A/D) converters 408 may be provided.

Reception of a complex signal calls for generation, upstream, of the in-quadrature signals $LO_I$ and $LO_Q$, i.e., having a phase shift of 90° with respect to one another. Generation of the tones $LO_I$ and $LO_Q$ with controlled phase shift calls for an accurate design of the circuit 50 that will limit as far as possible the inevitable cumulatable phase errors.

The techniques normally employed envisage use of PLL-based synthesizers that contain an oscillator, such as for example a voltage-controlled oscillator (VCO) 502, and multiphase filters or frequency dividers 504. The latter approach, however, envisages generation of a tone by the synthesizer, the frequency of which should be at least twice the desired one. Against this disadvantage, the active division circuit enables introduction of techniques for control of the phase error that can compensate also for possible phase errors accumulated in the receiving chain.

A typical problem of the low-IF receiver consists in the so-called "image response or rejection".

Figure 3A:
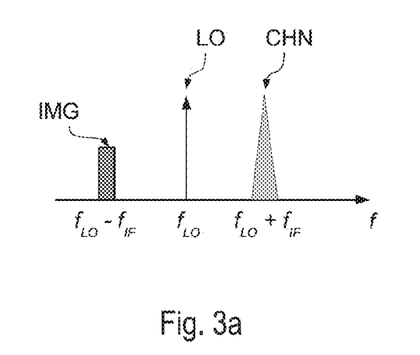
Figure 3B:
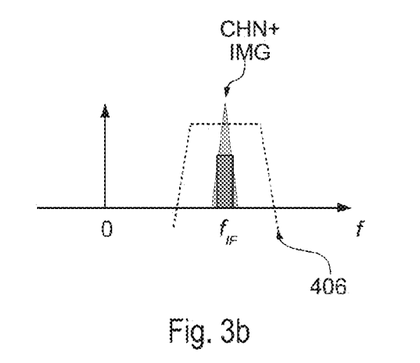

With reference to FIG. 3a, the aforesaid problem consists in the fact that a generic heterodyne system produces a frequency conversion both of the desired channel CHN, in this case at a frequency $f_{CHN}=f_{LO}+f_{IF}$, and of its image IMG positioned at $f_{IMG}=f_{LO}-f_{IF}$, which at this point cannot be rejected with a classic real analog filter, such as for example the filter 406, in so far as both of the channels are brought to the frequency $f_{IF}$, since the aforesaid components CHN and IMG come to be superimposed during demodulation in the demodulators 404 (see FIG. 3b).

Selection of the channel CHN may in any case be made by means of complex-filtering techniques, which can be implemented in an analog or digital way and operate on the complex (in-quadrature) signal received by selecting the desired channel CHN from the image IMG and from other possible out-of-band interfering signals. The effectiveness of the complex filter in rejection of the image IMG is, however, markedly affected by the phase and amplitude mismatch or errors that accumulate on the in-quadrature signals at input, where the phase mismatch is defined as the deviation with respect to the 90° phase shift expected between the signals I and Q, and the amplitude mismatch is defined as the lack of amplitude correspondence between the signals I and Q.

Figure 4:
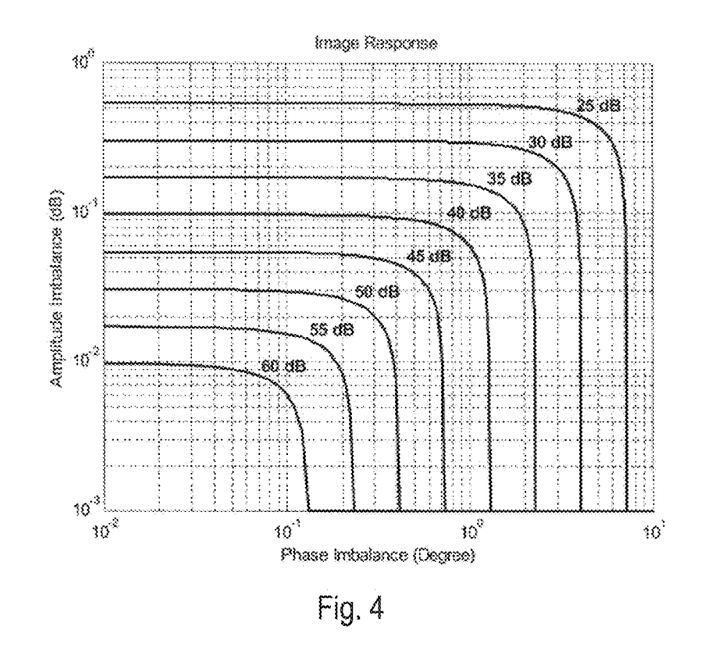

In particular, FIG. 4 shows the typical relation for image rejection (IR) with respect to the phase mismatch, or "Phase Imbalance", as appears on the horizontal axis, and the amplitude mismatch, or "Amplitude Imbalance", as appears on the vertical axis. The relation that expresses the image rejection IR with respect to the phase mismatch $\phi$ and the amplitude mismatch $\delta$ may be expressed also via the following equation:

$$IR = 10\log\frac{1 + 2(1 + \delta)\cos\varphi + (1 + \delta)^2}{1 - 2(1 + \delta)\cos\varphi + (1 + \delta)^2} \quad (2)$$

Consequently, normally techniques of correction of the aforesaid errors ($\phi, \delta \to 0$) are introduced in such a way as to maximize the image rejection that can be obtained in accordance with the specifications of the system and with the effective selectivity of the complex filter.

For instance, the technique described in Li Yu, W. Martin Snelgrove, "A Novel Adaptive Mismatch Cancellation System for Quadrature IF Radio Receivers", IEEE TRANSACTIONS ON CIRCUITS AND SYSTEMS—II: ANALOG AND DIGITAL SIGNAL PROCESSING, VOL. 46, NO. 6, JUNE 1999 (incorporated by reference), is one of the most widespread techniques because it operates digitally on the complex signal received, producing a simultaneous correction of amplitude and phase mismatch prior to filtering of the image.

Alternatively, the technique described in Oscar Steila, "Automatic In-phase Quadrature Balancing AIQB", October 2006 (Rev C: 7/10/2012) (copy located at URL http://www.qsl.net/iklxpv), incorporated by reference, may be used, where a mismatch compensation is made by correlating appropriately different harmonic contributions of the signal received. This approach calls, however, for an operation of fast Fourier transform (FFT), which is typically more burdensome from the computational standpoint.

In both of the above cases, the calibration signals may coincide with the signal received in operating conditions provided that the analog-to-digital conversion of the aforesaid signals is adequately performed by the purposely provided A/D converters (ADCs) both in terms of precision (number of bits) and of band (sampling frequency). In particular, the demand for high image rejections calls for analog-to-digital conversions that are very accurate in terms of precision, which tends to increase the number of bits and consequently the complexity and power consumption of the converter.

However, the increasing demand for low-consumption systems clashes with the need expressed previously of producing high-performance ADC circuits, which in general prove particularly burdensome from the consumption standpoint and frequently force the digital circuitry to operate at higher sampling frequencies, thus weighing even more heavily on the power budget.

Optimization of the circuits and appropriate distribution of the functions linked to selection of the channel CHN within the low-IF architecture may, however, contribute significantly to the reduction of the overall consumption of the system, reducing in particular the performance required of the ADC and the digital circuitry.

Figure 5:
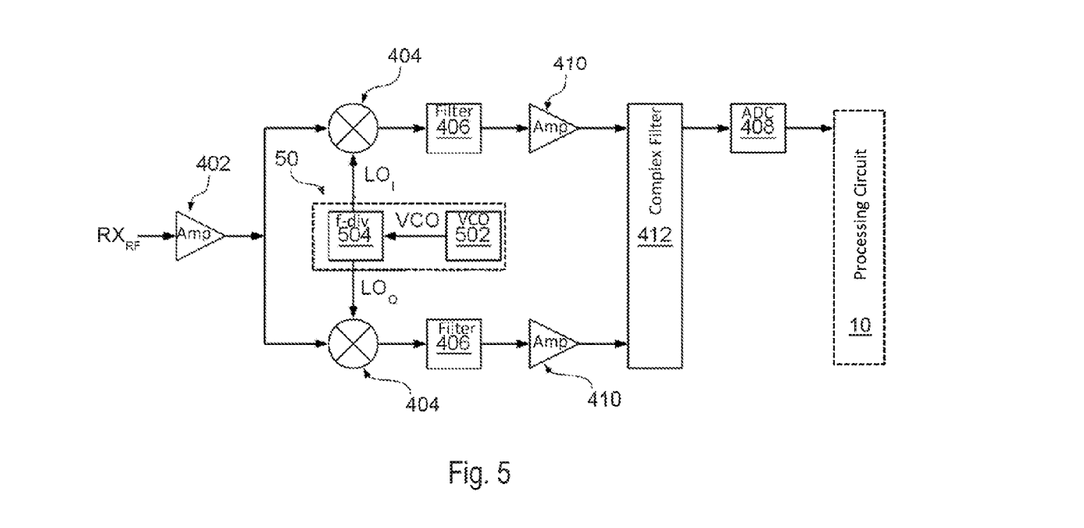

In this sense, the architecture proposed in FIG. 5 contemplates the presence of a complex filter 412 of an analog type upstream of the A/D conversion. The complex filter 412 is ideally able to select the desired channel CHN from any other interfering channel (including the image IMG), intrinsically limiting the band requirement and the resolution of the ADC and hence also the consumption of the processing unit 10.

Elimination of the image channel IMG moreover enables for some specific modulation formats demodulation of the channel received without necessarily having a complex signal, and consequently it is possible to eliminate also one of the two A/D converters 408.

Against the advantages set forth there remains open the problem of correction of the phase and amplitude errors at input to the complex filter 412, since in the presence of the aforesaid filter and of just one A/D converter of limited performance it is not possible to use the techniques proposed by Li Yu and Oscar Steila.

In the presence of the complex analog filter 412 and of just one A/D converter 408, it is necessary to make the correction of possible phase and amplitude errors in analog form using adequate circuit techniques. The amplitude errors may, for example, be compensated for by adding on each branch a respective amplifier with configurable amplification coefficient 410, for instance between the filter 406 and the filter 412. Instead, as regards the phase, it is possible to compensate for the errors by acting appropriately on the frequency dividers present within the I/Q generator, for example on the circuit 504.

There also exist different approaches that envisage making the correction of both of the errors by acting only on the I/Q components received at IF frequency prior to block 412.

SUMMARY

The inventors have noted that, irrespective of the approach adopted, it is necessary to have reference signals on which to act to make the calibration of the phase and amplitude errors. In particular, by exploiting the monotonic curve with single maximum appearing in FIG. 4, it is possible to correct the aforesaid errors by minimizing iteratively the level of the image signal received by the processing unit 10, compatibly with the specifications required by the application.

However, the effectiveness of the calibration depends upon the precision with which the relative variations of phase and amplitude of the complex signals are controlled and moreover requires a high spectral purity of the reference signal in terms of level of the interfering signals and of its own image.

One of the objects of the present disclosure is hence a technique for generating a calibration signal/tone with a high rejection of its own image component using the signals normally available within the transceiver, without resorting to external signals.

As mentioned previously, the present disclosure provides solutions for generating a calibration signal/tone with a high rejection of its own image component.

In various embodiments, the system comprises means, such as for example an oscillator, for generating a modulating tone/signal having a first frequency, for example between hundreds of kilohertz and some megahertz, and means for generating a carrier tone/signal having a second frequency, for example between hundreds of megahertz and some gigahertz. In particular, in the case where the system is used for calibration of a low-IF receiver, the carrier signal has a frequency at least twice the carrier frequency of the low-IF receiver, and the modulating signal has a frequency at least four times the intermediate frequency of the low-IF receiver.

In various embodiments, the system moreover comprises a single-sideband mixer configured for modulating the modulating signal on the carrier signal. For instance, such a single-sideband mixer may be obtained with two mixers and a combiner. In particular, the first mixer modulates the (first) modulating signal, typically the phase component, on the carrier signal. In this case, there is moreover generated a further modulating signal, typically the quadrature component, having the first frequency and being 90° phase-shifted with respect to the first modulating signal. In a similar way, also a second carrier signal is generated having the second frequency and being 90° phase-shifted with respect to the first carrier signal. Consequently, the second mixer modulates the second modulating signal on the second carrier signal. Finally, the combiner combines both of the radio-frequency signals.

In various embodiments, the system moreover comprises at least two frequency dividers by two connected in cascade, where the dividers receive at input the signal at output from the single-sideband mixer.

As will be described hereinafter, the calibration signal obtained in this way has a high rejection of its own image component.

The quality of the signal can be further increased by adding a further frequency divider by two and increasing the frequencies of the carrier signal and of the modulating signal accordingly.

In various embodiments, by adding a similar circuit and a mixer, the system can also be used in the case where the carrier signal has a frequency that is only twice the carrier frequency of the low-IF receiver.

BRIEF DESCRIPTION OF THE DRAWINGS

One or more embodiments will now be described, purely by way of non-limiting example, with reference to the annexed drawings, wherein:

FIGS. 1 to 5 have already been described previously;

It will be appreciated that, for greater clarity of illustration, the parts appearing in the figures are not to be considered necessarily as represented in scale.

Detailed Description

In the ensuing description, various specific details are illustrated aimed at providing an in-depth understanding of examples of one or more embodiments. The embodiments may be obtained without one or more of the specific details, or with other methods, components, materials, etc. In other cases, known structures, materials, or operations are not illustrated or described in detail so that various aspects of the embodiments will not be obscured. Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in various points of this description do not necessarily refer to one and the same embodiment. Furthermore, particular conformations, structures, or characteristics may be combined in any adequate way in one or more embodiments.

The references used herein are provided merely for convenience and hence do not define the sphere of protection or the scope of the embodiments.

As mentioned previously, the present disclosure provides a solution for generating a calibration signal/tone with a high rejection of its own image component, preferably in integrated form, using the signals normally available within a low-IF transceiver.

Figure 6:
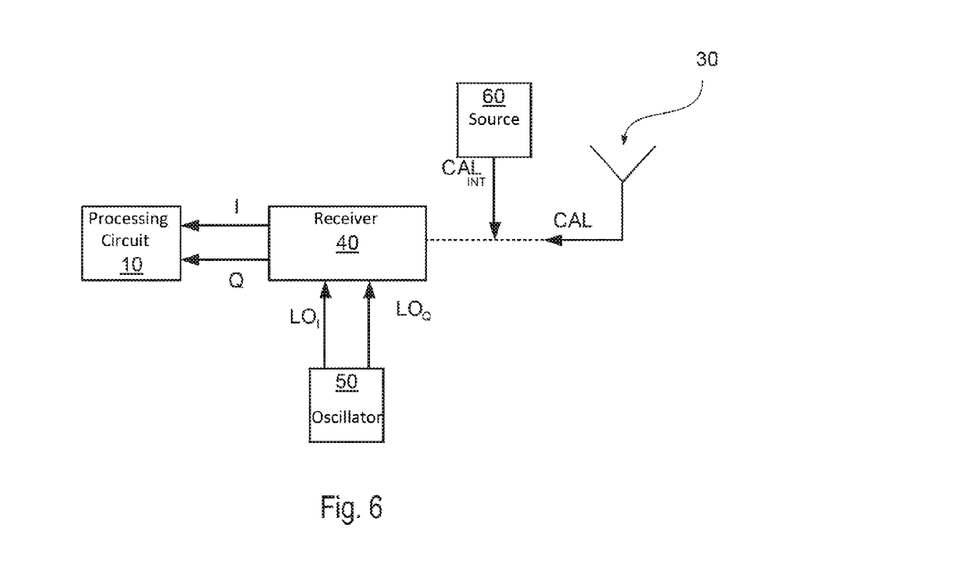
FIG. 6 is a block diagram illustrating in a general way the possible techniques of calibration for a receiver.

For instance, as illustrated in FIG. 6, a receiver 40 receives the signal from at least one antenna 30 and demodulates the signal received by means of at least one signal LO supplied by a synthesizer or oscillator 50. For instance, as also illustrated in FIGS. 2 and 5, in the case where the receiver 40 works with in-quadrature signals, the receiver uses two signals $LO_I$ and $LO_Q$ for demodulating the radio-frequency signal received.

However, frequently the receiver 40 and/or the signals $LO_I$ and $LO_Q$ are not ideal, and consequently a phase mismatch and/or an amplitude mismatch are/is introduced along the receiving chain.

For instance, to compensate for the aforesaid mismatch in a receiver as illustrated in FIG. 5, a calibration step may be envisaged in which the receiver 40 receives a radio-frequency calibration signal at input.

Calibration of the receiver 40 may in principle be made in field, in operating conditions, envisaging a system protocol that contemplates a step in which the individual nodes receive an external calibration signal $CAL_{EXT}$ for executing the procedures of correction of the phase and amplitude errors.

In some cases, the network-management protocol may, however, be complex and introduce additional latency and power consumption that may be incompatible with the overall specifications of the system.

For this reason, in some embodiments, the possibility is provided of calibrating the receiver independently, inserting therein a source 60 of an internal calibration signal $CAL_{INT}$. Consequently, this source 60 is independent of the external system and may be used in the time intervals in which the transceiver system is inactive. In this case, the internal calibration signal $CAL_{INT}$ that can be used for the calibration procedure should meet specifications of spectral purity that are quite stringent according to the performance required of the receiver 20.

The most traditional method for providing a signal with high spectral purity is that of using a synthesizer obtained, for example, with a PLL.

However, the inventors have noted that the introduction of a second synthesizer (instead of the source 60) in the transceiver system, which is used only for the step of self-calibration, is typically very burdensome in terms of area, especially in the case where the circuit uses integrated inductors, and potentially very critical in terms of crosstalk with the other sub-blocks of the system.

It would consequently be advisable to envisage a solution that produces the signal $CAL_{INT}$ via an appropriate combination of harmonic components that are typically present in the system.

In this context, the paper by S. Sen, et al., "DSP Assisted Low Cost IQ Mismatch Measurement and Compensation Using a Built in Power Detector", Microwave Symposium Digest (MTT), 2010 (incorporated by reference), describes a system and method for calibrating the mismatch of a receiver. In particular, in this paper an up-converter is used, such as for example the transmitter circuit 20, for generating the reference signal CAL$_{INT}$ for calibration of the receiver 40. In other words, the function of the circuit 60 of FIG. 6 is obtained via the transmitter 20, by generating, by means of the unit 10, appropriate I and Q baseband signals.

Figure 7:
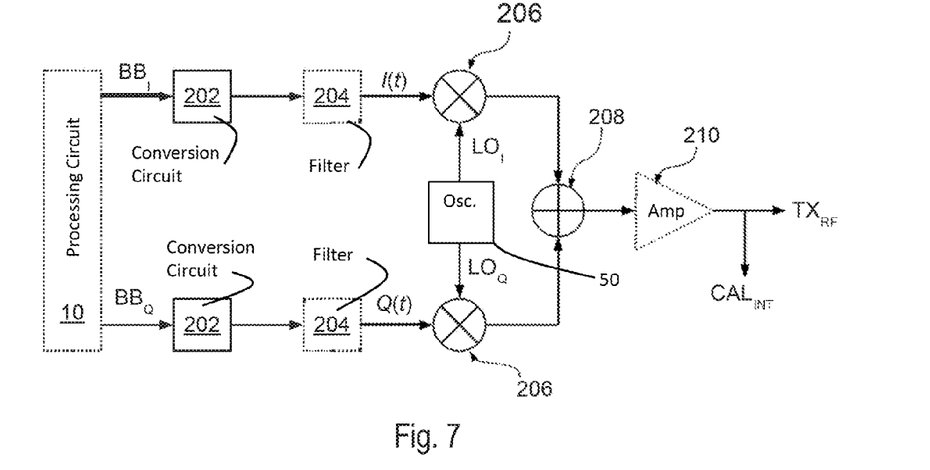
FIGS. 7 to 12 show various embodiments for generating a calibration signal.

In particular, as illustrated in FIG. 7, the transmitter is typically obtained by means of a single-sideband (SSB) mixer.

In particular, in the embodiment considered, the processing unit 10 generates two signals that are converted via respective circuits 202 into the baseband in-quadrature signals, i.e., a phase signal I(t) and a quadrature signal Q(t). For instance, each circuit 202 may comprise a digital-to-analog (D/A) converter and/or other circuits for modulation of the baseband signal, i.e., with the frequency $f_{IF}$. Furthermore, there may also be envisaged respective reconstruction filters 204, such as for example low-pass filters, which filter the baseband signals I(t) and Q(t).

In the embodiment considered, for each component I and Q a mixer 206 is provided that modulates the respective signal with the respective tone LO$_I$ or LO$_Q$ for generating radio-frequency signals.

Finally, the aforesaid radio-frequency modulated signals are recombined via a combiner 208. Such SSB mixers are well-known, which renders a detailed description of their operation unnecessary. For instance, typically at least one amplifier 210 is also provided for adapting the level of the signal obtained for the required purposes.

In general, the calibration signal CAL$_{INT}$ for calibration of the receiver 40 could be obtained by combining the tone LO with a low-frequency component, such as for example the frequency $f_{IF}$. For instance, the aforesaid component $f_{IF}$ could be obtained directly starting from the quartz-oscillator reference typically present in transceiver systems.

Use of such a single-sideband mixer (comprising the mixers 206 and the combiner 208) ideally enables suppression of the image component with respect to the tone synthesized.

However, on account of the phase and amplitude mismatch that is inevitably present also in this circuit block, the maximum rejection that can be obtained is typically between 20 and 30 dB. Given that the spectral purity of the calibration signal (especially with reference to its own image) is a necessary condition for making a precise compensation of the phase and amplitude errors of the receiver of FIG. 5, the solution just proposed is very limited in terms of performance that can be achieved.

The paper by S. Sen overcomes the problem just set forth by carrying out a pre-calibration of the up-converter of FIG. 7 using a power detector that determines the condition of calibration of the transmitter 20, reducing to a minimum the fluctuations of the power detected in time, i.e., the presence of a residual image tone superimposed on to the desired tone.

Consequently, the aforesaid method ideally solves the problem of the spectral purity of the calibration signal, it requiring a high sensitivity of the power detector and a considerable complexity of the algorithm for minimization of power fluctuation.

In one embodiment, the aforesaid problem is substantially avoided using a mixer 70 that generates a signal CAL'$_{INT}$ by combining two signals already potentially present in the circuit illustrated in FIG. 7, viz.

$$f_{BB}=4 \cdot f_{IF} \qquad (3)$$

$$f_{LO,Up\text{-}conv}=4 \cdot f_{LO,RX} \qquad (4)$$

i.e., the tones used have frequencies four times greater than those used in the receiver.

Figure 8:
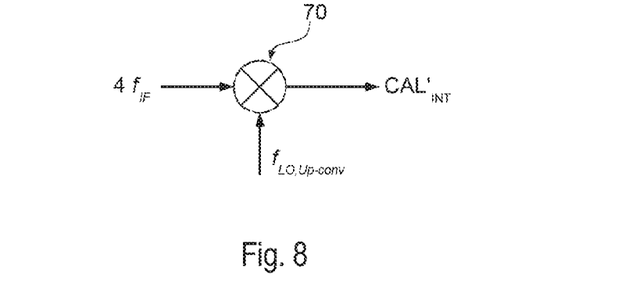

For instance, FIG. 8 shows a possible embodiment of a generator of the signal CAL'$_{INT}$. In particular, in the embodiment considered, a single sideband mixer 70 generates the signal CAL'$_{INT}$ by combining, i.e., multiplying, a signal having a frequency $f_{BB}=4 \cdot f_{IF}$ with a signal having a frequency $f_{LO,Up\text{-}Conv}=4 \cdot f_{LO,RX}$.

Consequently, the aforesaid SSB mixer 70 generates a signal with the following frequency:

$$f_{out}=f_{LO,Up\text{-}conv} \pm 4 \cdot f_{IF} = 4 \cdot (f_{LO,RX} \pm f_{IF}) = 4 \cdot f_{chn,img} \qquad (5)$$

where the symbol "±" in the tone generated indicates that the SSB mixer 70 can generate a tone with the frequency both of the channel CHN, in the case where the mixer 70 operates with the upper sideband (USB), and of the image IMG, in the case where the mixer 70 operates with the lower sideband (LSB). Selection between the two operating modes can be controlled, for example, by means of a simple selection mechanism that enables generation of the frequency of the channel CHN or of the image IMG, by appropriately swapping the input modulating signals.

In general, the mixer or SSB modulator 70 can be implemented with any architecture, such as for example a Hartley modulator or a Weaver modulator.

Figure 9:
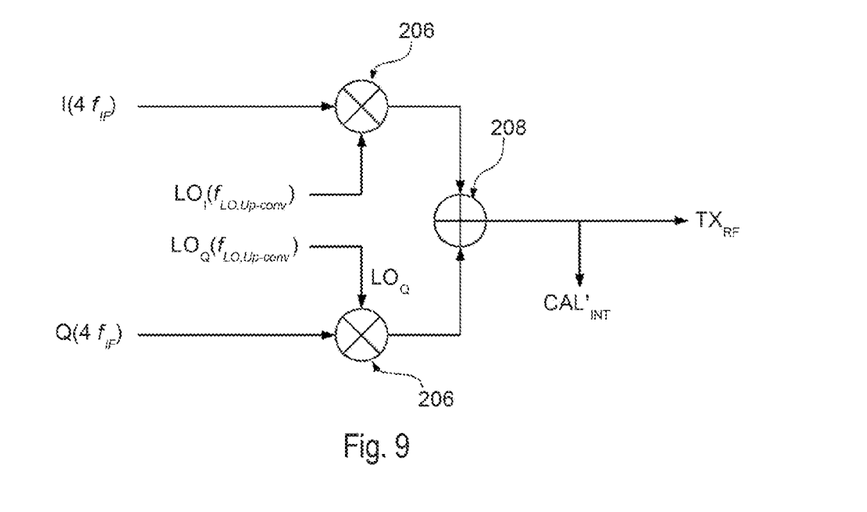

For instance, FIG. 9 shows an embodiment in which the up-converter illustrated in FIG. 7 is used for the aforesaid purpose; i.e., the transmitter circuit 20 is used as an SSB mixer.

In fact, by using an appropriate phase shift (i.e., 90°) between the components I and Q (with frequency 4 $f_{IF}$), the circuit illustrated in FIG. 7 behaves like an SSB mixer in the USB and LSB operating modes, for example by swapping the baseband signals I and Q, for instance by means of a selector.

Generation of the tone at 4 $f_{IF}$ does not in general present any particular difficulty since the quartz present in the system normally has an operating frequency that is typically higher: the aforesaid frequency can be appropriately divided with techniques in themselves known.

In general, the SSB mixer 70 could even receive just one component, for example the in-phase component I, and generate internally, via an appropriate phase shift, the second component, for example the quadrature component Q.

The availability of a tone LO with a frequency equal to 4 $f_{LO,RX}$ depends instead upon how the transceiver is conceived, and in particular upon how it is intended to produce the quadrature of the tone LO at input to the receiver.

For instance, as explained with reference to FIG. 2 or FIG. 5, the frequent use of at least one frequency divider by two within the generator 50, for example within the circuit 502, guarantees the presence of tones at a frequency at least twice the operating frequency at output from the synthesizer; i.e., the frequency of the signal VCO is typically twice or four times the frequency of the signals LO$_I$ or LO$_Q$.

Furthermore, there may be added another divider in the IQ generator block, which can preferably be activated optionally. For instance, such a divider is frequently already provided since it enables extension of the use of the receiver also on operating frequencies that are exactly one half the ones typically covered with a single division. For this reason, the components necessary for the synthesis described herein may also be already envisaged in the circuit 50.

Consequently, in some embodiments, the transmitter circuit 20, or preferably an additional SSB mixer 70, may be used for generating a signal $CAL'_{INT}$ having the following characteristics:

$$f_{out} = f_{LO,Up\text{-}conv} \pm 4 \cdot f_{IF} = 4 \cdot (f_{LO,RX} \pm f_{IF}) = 4 \cdot f_{chn,img}$$

Consequently, the signal $CAL'_{INT}$ has the main harmonic at a frequency that is four times the frequency of the tone CHN/IMG of the receiver 40. In some embodiments, the tone required for calibration $CAL_{INT}$ of the receiver 40 is hence directly obtained by means of a cascade of a pair of frequency dividers by two, the function of which guarantees not only that the tone $CAL_{INT}$ required for calibration will be obtained, but also that the corresponding image tone is rejected.

Figure 10:
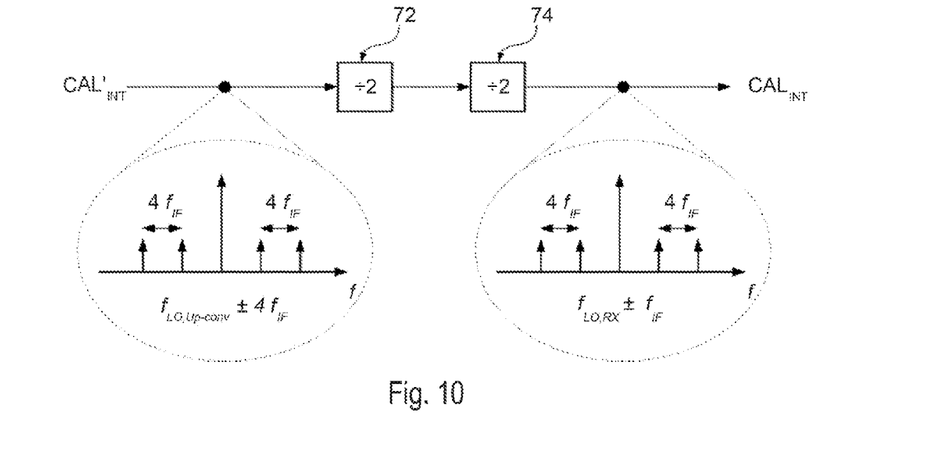

As represented schematically in FIG. 10, it may be noted experimentally or via simulation that the direct cascade of two frequency dividers by two 72 and 74 enables not only division by four of the frequency of the main tone at input ($f_{LO,Up\text{-}conv} \pm 4 \cdot f_{IF}$), but also preservation of the spacing of the spurious tones present in the input spectrum. The condition necessary for the aforesaid property to be guaranteed is strictly linked to the arrangement of the aforesaid spurious tones with respect to the fundamental tone: if the spurious tones present at input have a spacing $\Delta f = 4 \cdot f_{IF}$ that is constant (or multiple) and are present only around the main harmonics of the fundamental tone (including the DC component), then their spacing is preserved also at output. This property is moreover always guaranteed if only the spectrum at input to the second divider of the cascade is considered.

The spectrum produced by the SSB mixer in the operating conditions expressed in Eqs. (3) and (4) satisfies the condition referred to above and can be used for generating the spectrum at input to the cascade of two frequency dividers in such a way as to preserve the spacing between the spurious tones at output. In this way, the spectrum at output from the dividers will have the fundamental tone at the desired frequency, i.e., at $f_{LO,RX} \pm f_{IF}$, and a series of spurious tones at a multiple distance of $4 f_{IF}$ therefrom.

Since the image IMG of the main tone produced is at a distance equal to $2 f_{IF}$ from the frequency of the channel CHN (see FIG. 3a), the system proves suited to generating a tone with high rejection of its own image.

Furthermore, the interfering signals typically present on the resulting signal are set at distances that are multiples of $4 f_{IF}$ and can be filtered by the channel filter of the receiver.

Figure 11:
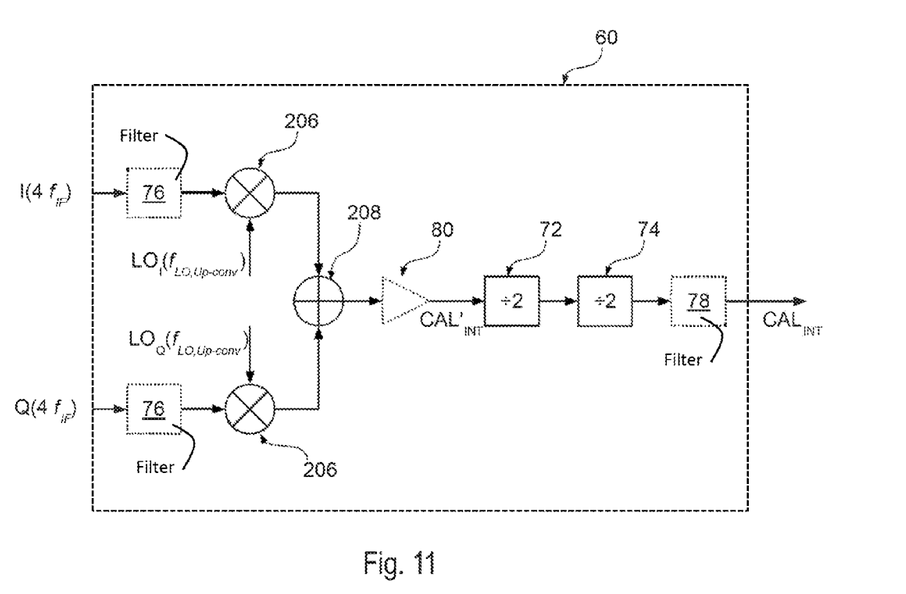

FIG. 11 shows an embodiment of the entire system 60 for generating the calibration signal $CAL_{INT}$ for a low-IF receiver 40.

Also in this case, the system comprises an SSB mixer for generating the signal $CAL'_{INT}$. For instance, in the embodiment considered, the system is configured for receiving two baseband signals I and Q with frequency $4 f_{IF}$. These signals are modulated through respective mixers 206 with tones $LO_I$ and $LO_Q$ with a frequency $f_{LO,Up\text{-}conv} = 4 \cdot f_{LO,RX}$. Next, to generate the calibration signal $CAL'_{INT}$, the modulated signals are combined at the node 208 and sent to a chain of two frequency dividers 72 and 74.

In some embodiments, there may be provided also buffers 80 and/or low-pass filters, the function of which is to limit the presence and the level of the undesired spurious tones within the chain in order to prevent possible effects of intermodulation within the receiving chain.

For instance, in the embodiment considered filters 76 are provided at input to the mixers 206 for filtering any possible high-frequency spurious tones in the signals $BB_I$ and $BB_Q$, which result from the baseband modulation. Consequently, the aforesaid filters 76 may also correspond to the filters 202 normally provided in the transmission circuit 20.

Furthermore, a filter 78 may be provided at output from the system 60 that filters the high-frequency spurious tones that are associated to the signals $LO_I$ and $LO_Q$.

Generation of the in-quadrature tone LO, i.e., the signals $LO_I$ and $LO_Q$, with the frequency $f_{LO,Up\text{-}conv}$, may be obtained in a way in itself known by using passive multiphase filters that produce a phase shift of approximately 90° at output, without producing any division in frequency.

The inventors have noted that the phase error on the signals $LO_I$ and $LO_Q$ introduced by the above technique does not particularly affect the functionality of the system, producing spurious tones of greater amplitude, but with the same spacing.

In general, the system can also be used in the case where the synthesizer 50, in particular the oscillator 502, only supplies a signal VCO with a frequency of $$f_{VCO} = 2 \cdot f_{LO,RX} \qquad (6)$$

i.e., the frequency of the signal produced by the synthesizer 50 is at the most twice the one required by the receiver 40.

Figure 12:
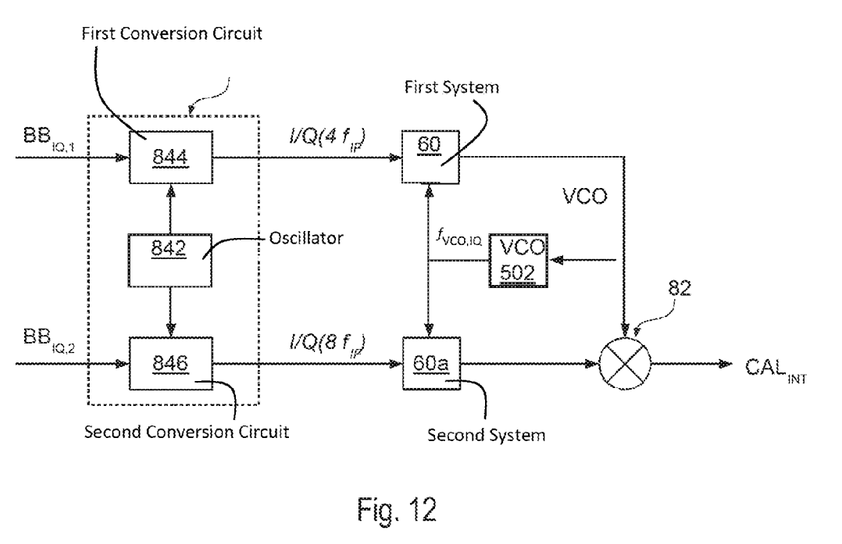

In this case, to generate the desired tone $CAL_{INT}$, combination (mixing) of the signals at output from two similar systems 60 and 60a obtained by means of a mixer 82 can be used.

In fact, assuming that the frequency produced by the synthesizer is $2 \cdot f_{LO,RX}$, the two tones $f_{out,1}$ and $f_{out,2}$ produced by two systems 60 and 60a are combined according to the following formulas:

$$f_{out,1} = \frac{f_{VCO} \pm 4 \cdot f_{IF}}{4} \qquad (7)$$

$$f_{out,2} = \frac{f_{VCO} \mp 8 \cdot f_{IF}}{4} \qquad (8)$$

$$f_{mixing} = f_{out,1} + f_{out,2} = \frac{2 \cdot f_{VCO} \mp 4 \cdot f_{IF}}{4} = \frac{2 \cdot f_{LO,RX}}{2} \mp f_{IF} \qquad (9)$$

where $f_{out,1}$ and $f_{out,2}$ are the frequencies of the main tones supplied by the respective systems 60 and 60a, the respective baseband inputs of which have respective frequencies equal to $4 f_{IF}$ and $8 f_{IF}$.

A possible embodiment of the resulting system appears in FIG. 12.

In general, the block 502 corresponds to the multiphase filter that performs quadrature of the signal VCO with frequency $f_{VCO} = 2 \cdot f_{LO,RX}$.

In one embodiment, generation of the input signals is obtained by means of a block 84. For instance, this block could also be integrated in the block 202 used for generation of the baseband signals I and Q during data transmission.

In particular, in the embodiment considered, the block 84 comprises a frequency reference (typically a quartz oscillator) 842 that generates a signal with a frequency that is a multiple of the frequency $f_{IF}$, in particular at least eight times the frequency $f_{IF}$.

The above signal of the oscillator 842 is supplied to a circuit 844 that performs a frequency division and generates the baseband signals I and Q with a frequency of $4 f_{IF}$. For instance, considering an oscillator that generates a signal at 24 MHz and a frequency $f_{IF}$ of 300 kHz, the circuit 844 would apply a division by twenty; i.e., the baseband signals I and Q at output from the circuit 844 have a frequency of 1.2 MHz. These baseband signals are sent to a first system 60 that generates a signal with the characteristics expressed in Eq. (7).

The signal of the oscillator 842 is supplied also to a second circuit 846 that performs a frequency division and generates the baseband signals I and Q with a frequency of 8 $f_{IF}$. For instance, considering an oscillator 842 that generates a signal at 24 MHz and a frequency $f_{IF}$ of 300 kHz, the circuit 846 would apply a division by ten; i.e., the baseband signals I and Q at output from the circuit 846 have a frequency of 2.4 MHz. These baseband signals are sent to a second system 60a that generates a signal with the characteristics expressed in Eq. (8).

Finally, the mixer 82 combines the signals at output from the systems 60 and 60a for generating the signal $CAL_{INT}$ according to Eq. (9).

In general, also different signals I and Q may be used for the systems 60 and 60a, for example by supplying via the processing unit 10 respective signals $BB_{IQ,1}$ and $BB_{IQ,2}$. For instance, in this way in-quadrature signals may be supplied such that their difference in frequency is always equal to $4f_{IF}$.

In general, the system is able to synthesize the calibration signal both in the case where Eq. (4) is satisfied and in the case where Eq. (6) is satisfied. In the second case, however, the presence of a higher number of spurious tones, due to the presence of two frequency shifters and the corresponding combination, produces at the image frequency a potentially non-zero component, rejection of which is strictly linked to the selectivity of the filters 78 appearing in FIG. 11.

The present disclosure thus provides an innovative technique for generation of an analog signal with high rejection of its own image, which can typically be used for calibration of the phase and amplitude errors in low-IF receivers. This technique is particularly suited to integration since it synthesizes the desired signal/tone starting from the harmonic components typically present in a transceiver system, i.e., the output signal of the synthesizer 50 and the quartz reference 842. The technique can generically be applied irrespective of the architectural variants of the receiver 40 and the calibration techniques, and can be obtained by means of appropriate combination of basic functional blocks in themselves known in the literature that can be variously implemented in the circuit, such as mixers, low-pass filters, frequency dividers, and multiphase filters. The only condition necessary for creation of the structure lies in the fact that the output frequency of the tone produced by the synthesizer is an integer power of at least 2 with respect to the frequency of the tone LO required by the receiver 40.

Of course, the details of construction and the embodiments may vary, even significantly, with respect to what has been illustrated herein purely by way of non-limiting example, without thereby departing from the sphere of protection, as defined by the annexed claims.

The invention claimed is:

1. A system for generating a calibration signal, comprising:
    a first source circuit configured to generate a first modulating signal having a first frequency;
    an oscillator configured to generate a first carrier signal having a second frequency; and
    a first circuit comprising:
        a first single-sideband mixer configured to modulate said first modulating signal on said first carrier signal; and
        at least two frequency dividers by two connected in cascade, wherein said at least two frequency dividers by two connected in cascade receive said first modulating signal modulated on said first carrier signal and output a first intermediate calibration signal;
    a second source circuit configured to generate a second modulating signal having a third frequency that is twice said first frequency;
    a second circuit comprising:
        a second single-sideband mixer configured to modulate said second modulating signal on said first carrier signal; and
        at least two further frequency dividers by two connected in cascade, wherein said at least two further frequency dividers by two connected in cascade receive said second modulating signal modulated on said first carrier signal and output a second intermediate calibration signal; and
    a mixer configured for generating said calibration signal via modulation of the first intermediate calibration signal with the second intermediate calibration signal.

2. The system according to claim 1, wherein said single-sideband mixer comprises one of a Hartley modulator or a Weaver modulator.

3. The system according to claim 1, comprising:
    a phase shifting circuit configured to generate a second carrier signal having said second frequency and being 90° phase-shifted with respect to said first carrier signal;
    wherein said first single-sideband mixer comprises:
        a first mixer configured to modulate an in-phase component of said first modulating signal on said first carrier signal;
        a second mixer configured to modulate a quadrature phase component of said first modulating signal on said second carrier signal; and
        a combiner configured to combining outputs of the first and second mixers.

4. The system according to claim 1, wherein said first circuit comprises: at least one input low-pass filter configured to filter said first modulating signal.

5. The system according to claim 1, wherein said first circuit comprises: at least one output low-pass filter configured to filter the first calibration signal.

6. The system according to claim 1, wherein said first modulating signal is an intermediate-frequency signal.

7. The system according to claim 1, wherein said first carrier signal is a radio-frequency signal.

8. A transceiver, comprising:
    a system for generating a calibration signal; and
    a receiver circuit configured to receive a radio-frequency signal, wherein said receiver circuit is configured for receiving said calibration signal during a calibration step;
    wherein the system for generating comprises:
        a first source circuit configured to generate a first modulating signal having a first frequency;
        a second source circuit configured to generate a second modulating signal having a second frequency that is twice the first frequency;
        an oscillator configured to generate a first carrier signal having a third frequency;
        a first circuit comprising:
            a first single-sideband mixer configured to modulate said first modulating signal on said first carrier signal; and
            a first at least two frequency divider circuit configured to divide said first modulating signal modulated on said first carrier signal and output a first intermediate calibration signal;
a second circuit comprising:
  a second single-sideband mixer configured to modulate said second modulating signal on said first carrier signal; and
  a second frequency divider circuit configured to divide said second modulating signal modulated on said first carrier signal and output a second intermediate calibration signal; and
a mixer configured to generate said calibration signal by mixing together the first and second intermediate calibration signals.

9. The transceiver according to claim 8, wherein said receiver circuit is a low-IF receiver.

10. The transceiver according to claim 8, comprising a transmitter circuit, wherein said system for generating a calibration signal is configured to use said transmitter circuit as said single-sideband mixer configured for modulating said first modulating signal on said first carrier signal.

11. A method for generating a calibration signal, comprising the steps of:
  generating a first modulating signal having a first frequency;
  generating a second modulating signal having a second frequency that is twice the first frequency;
  generating a first carrier signal having a third frequency;
  modulating via a first single-sideband mixer said first modulating signal on said first carrier signal;
  generating a first intermediate calibration signal via a frequency division by at least four of said first modulating signal modulated on said first carrier signal;
  modulating via a second single-sideband mixer said second modulating signal on said first carrier signal;
  generating a second intermediate calibration signal via a frequency division by at least four of said second modulating signal modulated on said first carrier signal; and
  mixing said first and second intermediate calibration signals together to generate said calibration signal.

12. A system for generating a calibration signal, comprising:
  a first source circuit configured to generate a first modulating signal having a first frequency;
  a second source circuit configured to generate a second modulating signal having a second frequency that is twice the first frequency;
  an oscillator configured to generate a carrier signal having a third frequency; and
  a first mixing circuit configured to mix the first modulating signal with the carrier signal and divide by four to generate a first intermediate calibration signal;
  a second mixing circuit configured to mix the second modulating signal with the carrier signal and divide by four to generate a second intermediate calibration signal; and
  a third mixing circuit configured to mix the first intermediate calibration signal with the second intermediate calibration signal to generate said calibration signal.

13. The system of claim 12, wherein each of the first and second mixing circuits comprises:
  a single-sideband mixer configured to modulate one of the first and second modulating signals on said first carrier signal; and
  at least two frequency dividers by two connected in cascade to an output of the single-sideband mixer.

14. The system of claim 12, further comprising a RF receiver circuit having an input connected to an antenna, and wherein said calibration is applied to said input when the RF receiver circuit is configured for operation in a calibration mode.

15. The system of claim 14, further comprising an RF transmitter circuit and the first source circuit comprises a baseband modulator of the RF transmitter circuit.

16. The system of claim 14, wherein the oscillator comprises a transmitter local oscillator of said RF transmitter circuit.

17. The system of claim 14, wherein the RF receiver circuit is a low-IF receiver.

* * * * *